(12) United States Patent
Weingarten

(10) Patent No.: US 8,745,317 B2
(45) Date of Patent: Jun. 3, 2014

(54) SYSTEM AND METHOD FOR STORING INFORMATION IN A MULTI-LEVEL CELL MEMORY

(75) Inventor: Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 559 days.

(21) Appl. No.: 13/080,502

(22) Filed: Apr. 5, 2011

(65) Prior Publication Data

US 2011/0252188 A1    Oct. 13, 2011

Related U.S. Application Data

(60) Provisional application No. 61/321,747, filed on Apr. 7, 2010.

(51) Int. Cl.
*G06F 12/00* (2006.01)

(52) U.S. Cl.
USPC .......................... 711/103; 711/117; 711/202

(58) Field of Classification Search
None
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |

(Continued)

FOREIGN PATENT DOCUMENTS

WO    WO2009053963 A2    4/2009

OTHER PUBLICATIONS

Search Report of PCT Patent Application WO 2009/118720 A3, Mar. 4, 2010.

(Continued)

*Primary Examiner* — Shawn X Gu
(74) *Attorney, Agent, or Firm* — Dentons US LLP

(57) ABSTRACT

A method comprising: obtaining a value of source data; encoding the value of source data using an encoding process, to thereby obtain an encoded value; calculating a difference value based on the value of source data and the encoded value; mapping the difference value to a multi-digit binary value associated with a voltage level based on a mapping scheme; causing a cell of a multi-level cell memory to store the mapped multi-digit binary value; and causing the encoded value of source data to be stored in the multi-level cell memory.

32 Claims, 11 Drawing Sheets

(56) References Cited

U.S. PATENT DOCUMENTS

| | | |
|---|---|---|
| 5,956,268 A | 9/1999 | Lee |
| 5,956,473 A | 9/1999 | Hu et al. |
| 5,968,198 A | 10/1999 | Balachandran et al. |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |

(56) References Cited

U.S. PATENT DOCUMENTS

| | | |
|---|---|---|
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 * | 6/2008 | Park et al. ............... 365/185.03 |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3, Mar. 4, 2010.

Search Report of PCT Patent Application WO 2009/078006 A3, Mar. 4, 2010.

Search Report of PCT Patent Application WO 2009/074979 A3, Mar. 4, 2010.

Search Report of PCT Patent Application WO 2009/074978 A3, Mar. 4, 2010.

(56) References Cited

OTHER PUBLICATIONS

Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, p. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.

Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "Eeprom Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

SYSTEM AND METHOD FOR STORING INFORMATION IN A MULTI-LEVEL CELL MEMORY

CROSS-REFERENCE TO RELATED APPLICATION

This application claims the benefit of U.S. Provisional Patent Application No. 61/321,747, filed Apr. 7, 2010, which is incorporated herein by reference in its entirety.

FIELD OF THE INVENTION

Embodiments of the present invention relate to systems and methods for using multi-level non-volatile memory for storing information, and analog information in particular.

BACKGROUND OF THE INVENTION

Digital storage devices may store digital information representing data from an information source. For many applications, the information source may not be digital itself, but may instead be analog. In such cases, the analog source information may typically be first converted into a digital format and then stored in a digital medium. Some information may be lost in the analog-to-digital conversion. Moreover, during compression of the digital data, additional data may be lost, particularly where "lossy" compression is used.

In particular, a storage medium may be inherently analog; however, through error correction, it may be represented as a "perfect" digital medium. Therefore, the storage procedure may include first encoding the analog source in digital format such that only acceptable distortions are allowed (source coding), and then encoding the resulting digital information against errors that may occur in the analog storage media such that following some retention the digital data could be perfectly reconstructed (channel coding).

One example of such analog-to-digital conversion and compression is in digital images, specifically, JPEG compression of images. The standard JPEG encoding is well documented, however, the following is a brief description of the steps of JPEG encoding.

First, in the image representation stage, an image is broken up into pixels and each pixel is represented using three components: the brightness (Y), and chrominance (Cb and Cr, for blue and red color components). Images in other formats, e.g., RGB, may be reformatted into YCbCr format. The image is now represented by 3 matrices, a matrix for each component.

In the block splitting stage, the matrices are broken up into sub-matrices, for example, 8×8 or 16×16 sub-matrices of the whole image array of pixel values.

In the cosine transform stage, each sub-matrix is transformed into the frequency domain by using a two dimensional cosine transform. The result of this step is a sub-matrix, e.g., 8×8, whose elements are the frequency domain representation of the original sub-matrix.

In the quantization stage, each element in the frequency domain is quantized. As the human eye is more sensitive to amplitude of the lower frequency, the higher frequencies are quantized more coarsely. The quantization is performed by dividing the result of the cosine transform by a quantization matrix and then rounding the result. In this step, original source information may be lost. This step also determines the compression ratio: quantization matrices with higher values will result in higher compression, but with more loss of information in the reconstructed image.

Finally, the entropy coding stage is a compression step for storage purposes. Typically, Huffman coding is used to compress the quantized results of the cosine transform. Before the Huffman coding, the elements of the cosine transform are ordered in a predefined manner as to facilitate a higher compression rate.

FIG. 1 depicts a generalized schematic diagram of prior art system 100 for source and channel encoding and decoding. A processor 105 may obtain data from an analog source 110 and provide it to a source encoder 120, which outputs digitized source information to a channel encoder 130 to create encoded data. The encoded data is stored on storage medium 140. Upon retrieval, retrieved encoded data may include a limited number of errors. Some of these may be corrected by channel decoder 150 to obtain corrected retrieved encoded source information, which is then source-decoded by source decoder 160, to obtain retrieved or reconstructed source data 170.

It is expected that when there are no errors, the analog source may be reconstructed almost perfectly, and that when there are errors the analog source may still be reconstructed, albeit with some errors. However, one drawback of this scheme is that if the number of errors in the return source channel is beyond a certain threshold, the original source information may be reconstructed incorrectly such that it is far removed from the original.

In such conventional systems and methods, distortions may occur during source encoding, e.g., converting the analog information into digital information. In addition, errors may occur during storage and retrieval. The above process may suffice for many applications, even where data is lost in the source coding and/or channel coding. However, in instances requiring high fidelity, reconstruction of the information obtained using the above exemplary process may result in distorted or damaged output. Thus, for example, to correct such storage errors with increased accuracy, a channel encoder may increase the amount of error correction data (redundancy bits) generated and stored for the transformed digital information. However, the amount of error correction data used to achieve sufficient accuracy, e.g., a maximum error probability on the order of $10^{-15}$ according to flash memory system standards, may be great, occupying an inflated amount of the digital storage resources, and requiring additional computing time.

There is therefore a need for an improved method for storing information, particularly analog information, for which high fidelity may be beneficial.

SUMMARY OF EMBODIMENTS OF THE INVENTION

According to embodiments of the invention, there are provided a system, method device for writing source data to a multi-level cell memory by obtaining a value of source data, encoding the value of source data using an encoding process, to thereby obtain an encoded value, calculating a difference value based on the value of source data and the encoded value, mapping the difference value to a multi-digit binary value associated with a voltage level based a mapping scheme, causing a cell of the multi-level cell memory to store the mapped multi-digit binary value, and causing the encoded value of source data to be stored in the multi-level cell memory.

According to some embodiments of the invention, the mapping scheme may map difference values within increasing ranges to multi-digit binary values having increasing associated voltage levels.

According to some embodiments of the invention, the multi-digit binary values may be associated with respective voltage levels, so that no more than one bit of the multi-digit binary value differs between adjacent voltage levels.

According to some embodiments of the invention, the difference values may be quantized before being mapped.

According to some embodiments of the invention, multi-digit binary values may represent more than one difference values.

According to some embodiments of the invention, the source data may be raw image data, the encoding process may be a JPEG encoding process, and at least one of entropy coding and error correction coding may be performed on the encoded data prior to causing the encoded value of source data to be stored.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
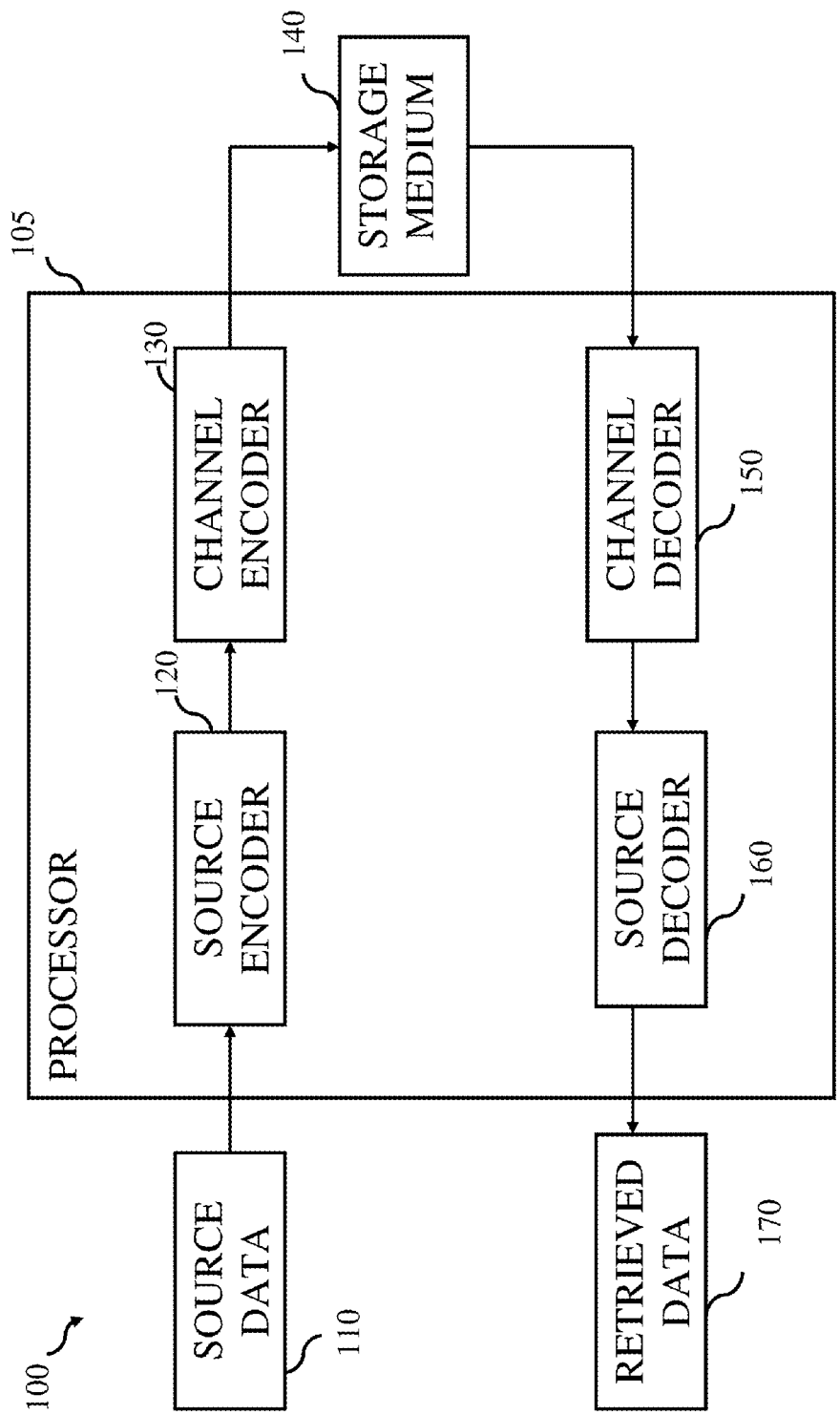
FIG. 1 depicts a generalized schematic diagram of prior art system for source and channel encoding and decoding.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently.

It will be understood that analog information may be used to representation analog or real objects such as image, video, or audio data. Analog information may define values that may vary continuously or that may assume any of an infinite number of potential values, or a greater number of potential values than those that may be stored in the intended storage scheme.

Figure 2:
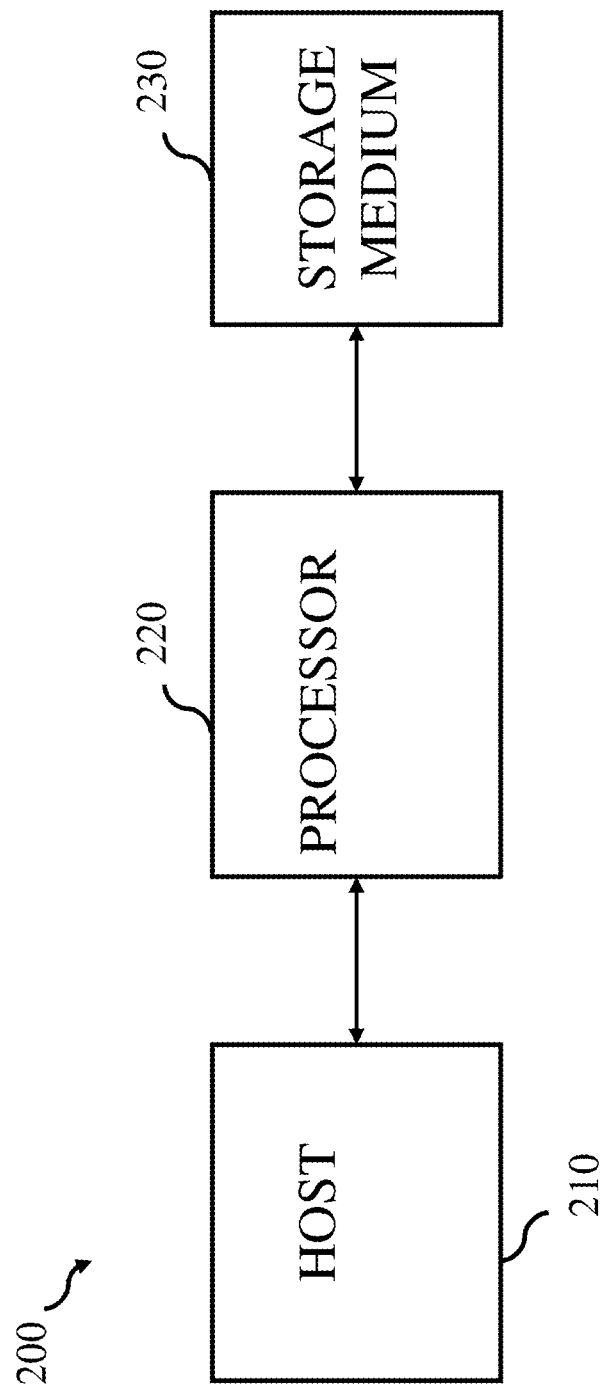
FIG. 2 depicts a generalized schematic diagram of memory system according to embodiments of the invention.

FIG. 2 depicts a generalized schematic diagram of memory system 200 according to embodiments of the invention. A host device 210 may be any device having information, such as analog information, to be stored. An example host device may be a digital video or still image camera, an audio recording device, or the like, or a computer connected to any such device. Host device 210 may communicate the data to be stored to a processor or memory controller 220 over a host interface. The processor 220, which may be associated with random-access memory (RAM) buffers (not shown), may encode the data in accordance with embodiments of the invention, and store the data as appropriate in one or more non-volatile memory 230, such as, a flash memory or semiconductor memory. It will be understood that host device 210 and memory controller 220 may be include or be part of a computer device capable of executing a series of instructions to write, read, modify, erase, store, save, process, encode, decode, compute, edit, receive, transfer, display, or otherwise use or manipulate data. Such computer devices may include one or more computers, workstations, cellular device, tablet devices, personal digital assistants (PDA), video game consoles, etc. It will be understood that the retrieval and decoding process is substantially identical in the reverse order.

Figure 3:
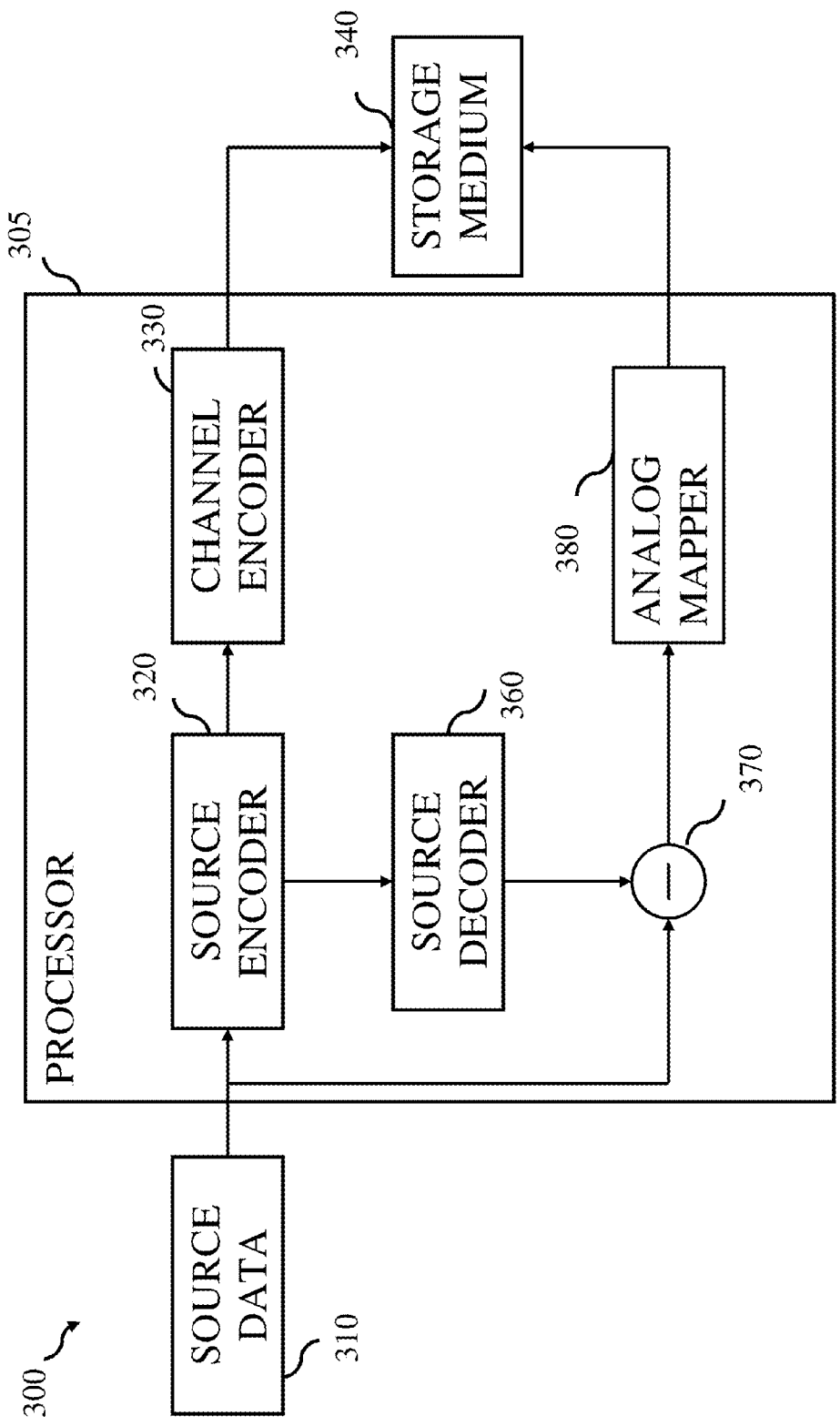
FIG. 3 depicts a generalized schematic diagram of a system for source and channel encoding according to an embodiment of the present invention.

FIG. 3 depicts a generalized schematic diagram of a system 300 for source and channel encoding according to an embodiment of the present invention. System 300 may include a processor 305 to read, write, and/or erase data between a host providing source analog information 310 and storage medium 340, such as a multi-level cell non-volatile memory. Processor 305 may obtain source analog information 310, which may be then encoded by source encoder 320, which may be similar or identical to a source encoder according to the prior art, e.g., an encoding standard such as MPEG, JPEG, MP3, etc. A channel encoder 330 may perform channel encoding on at least a portion of the source-encoded data, for example, using known error correction algorithms, which may then be stored in Flash storage memory 340, as known in the art. According to embodiments of the invention, difference information may be obtained or calculated between the source-encoded data and the analog source information. In the illustrative depiction of FIG. 3, the source-encoded data may be source-decoded by source decoder 360, thereby approximating the reconstructed data (assuming no storage errors) and compared with the analog source data, for example, by a subtractor or comparator 370. The difference information may be mapped by analog mapper 380 and stored in Flash memory 340, for example, as described in further detail herein.

Storage medium 340 may include one or more external drives such as a disk or tape drive, a universal system bus (USB) drive, a solid-state drive, a memory card such as a SD card, a network card, an input/output device port or a memory in an internal or external device. Storage medium 340 may be a non-volatile or semiconductor memory such as a flash memory (NOR-type flash memory or negated AND (NAND)-type flash memory) or a phase-change random access memory (PRAM). Storage medium 340 may store information in a digital format. Storage medium 340 may include a multi-level cell (MLC) memory storing multiple bits of information in each memory cell. It will be understood that storage medium 340 is schematic, and that devices according to embodiments of the invention may use multiple storage devices, for example, one to store channel-encoded data, and another to store analog mapped data, as described below.

Source data 310 may be internal or external to processor 305. Source data may come from a buffer memory, which may be a non-volatile or volatile memory. A volatile memory may include buffer memory, cache memory, random access memory (RAM), dynamic RAM (DRAM), scratchpad memory, or other suitable memory units or storage units for direct use by a processor 305. Volatile memory may be used for short-term storage, while non-volatile memory may be used for long-term memory storage. Source data 310 may be or include or be at least partially derived from information in an analog format, for example, representing an analog data source, such as, an image, video or sound track.

To transfer information in an analog format from source data 310 to a digital format in storage medium 340, processor 305 may include a source encoder 320 and a channel encoder 330. Source encoder 320 may transform the analog information into digital information and channel encoder 330 may encode the transformed digital information with error correction or redundancy bits to minimize errors upon storage or the digital information.

In some embodiments of the invention, the entire source-encoded data is channel-encoded and stored. In such instances, the analog-mapped difference information may be used as an error-correction to correct distortion errors. However, as discussed below, in order to obtain memory-saving benefits, or graceful source reconstruction degradation benefits, some embodiments of the present invention may channel-encode and/or store only a most significant portion of the source-encoded data, while a complementary least significant portion of the data may be stored as analog-mapped difference information. In such embodiments of the invention, the analog-mapped difference information is used as a primary data storage for such least significant portion of the data, rather than as merely error-correction data.

According to embodiments of the invention, analog difference data may be generated using the source data prior to channel encoding and stored for use as analog error correction for a more accurate analog representation of the coding error. For example, in some embodiments of the invention, to generate analog error correction data, the original analog source information may be encoded by source encoder 320 and then source-decoded by source decoder 360. A logic unit such as a subtractor 370 may generate the distortion measure or analog error data, for example, using a measure of difference, distance or ratios between the original analog information and the reconstructed analog information. A greater difference may indicate a greater degree of error in the source encoding/decoding.

Various difference functions may be used in connection with logical operator 370 in accordance with embodiments of the invention. In one embodiment, the difference information for a source-encoded value may be an associated distortion measure, which may be proportional to, $|x-r|$, the absolute value of the difference between the analog source data (x) and the estimated reconstituted value (r), and a sign indicating whether the difference is positive or negative. Accordingly, the distortion in reconstructed source information may be small for values associated with a small distortion measure and large for values associated with a large distortion measure.

Additional errors may be generated when storing the analog difference or error data in a digital format in storage medium 340. For example, analog values corresponding to a digital bit value may be erroneously retrieved as a different digital bit value. Such errors may be more probable in multi-level cell (MLC) memories, which may be more sensitive than single-level cell (SLC) memories. In addition, in conventional systems, there may not be any restriction on the size of each error. For example, an error may be equally likely to occur in a most significant bit as a least significant bit. Thus, a single-bit error may result in a large reading error.

According to embodiments of the invention, processor 305 may further reduce the size of storage errors by storing the difference information using an analog mapper 370, as described in further detail hereinbelow. According to some analog mapping and storage schemes described below, since voltage levels typically only deviate slightly between programming and reading, e.g., by a single voltage range, even misread MLC voltage levels may result in only slight deviations in the final result.

An analog mapper 370 may determine the analog error data (e.g., from logic unit 370) by dividing the analog values into a plurality of ranges, for example, sequentially increasing in value. That is, a gradation of error differences may be determined based on the expected distortion caused by source-encoding. For example, according to some embodiments of the invention, analog mapper 370 may map values in each analog value range to a different one of the multiple ($2^N$) states or bit values of a single cell of N-level multi-level cell of storage medium 340. Thus, for example, a three-bit per cell device, each cell may have eight error values. These error values may be mapped to eight analog ranges, and an analog error or difference falling within any range may be mapped to a particular one of the eight levels of the MLC, as described below. In some embodiments, the mapping may be linear, e.g., the ranges may have equal spans, while in other embodiments, the mapping may be non-linear, e.g., the ranges may have different spans.

In some embodiments of the invention, each in a sequence of analog value range may be mapped to a respective sequentially increasing one of the multiple states or bit values of the multi-level cell. Accordingly, in some embodiments of the invention, the analog value ranges may be proportional to the voltage ranges of the mapped bit values. Thus, for example, a higher voltage level may indicate a higher error. Upon retrieval of the voltage level of the MLC storing this difference data, the difference may be added or subtracted from the source-decoded data.

Figure 4:
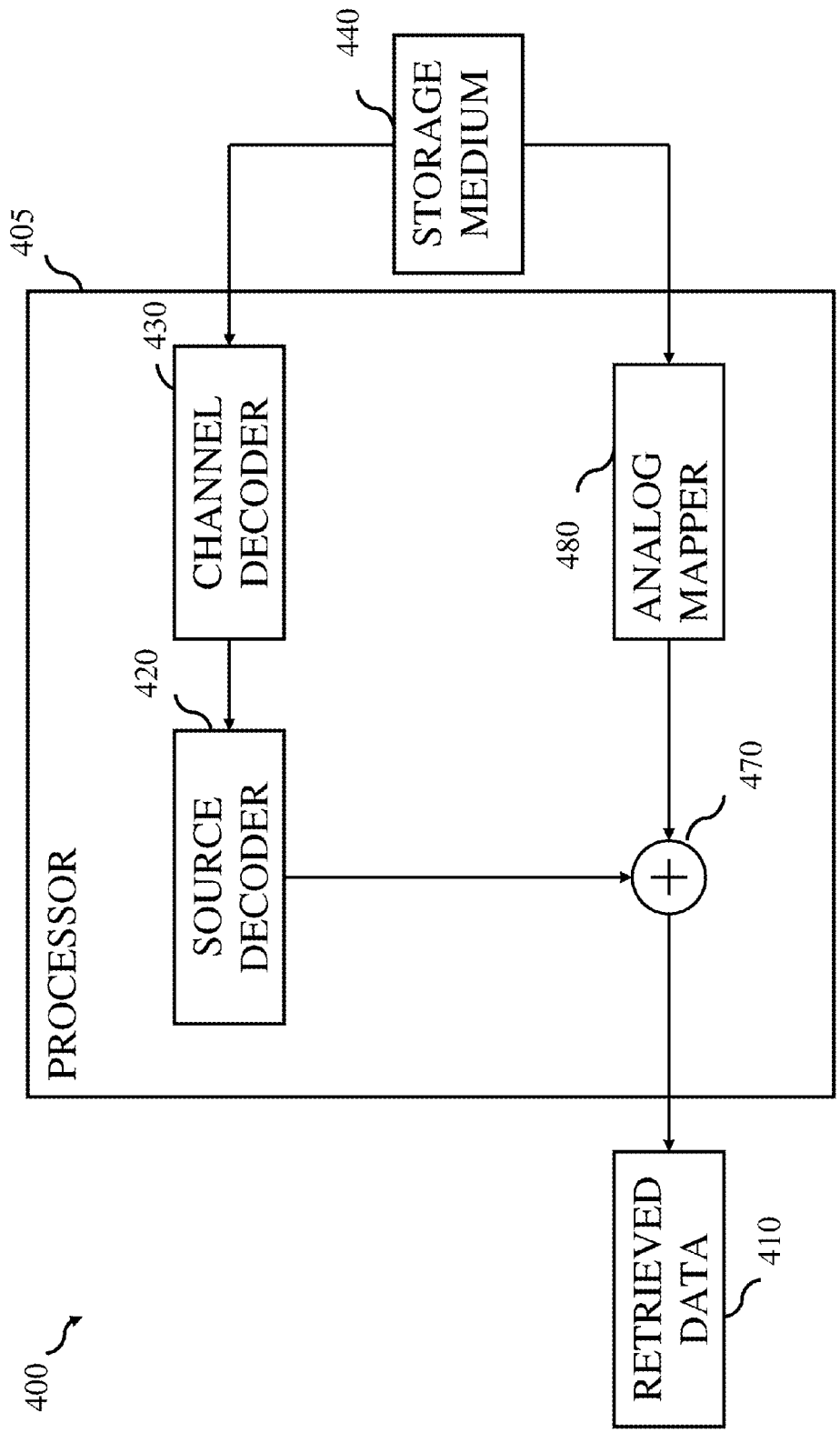
FIG. 4 depicts a generalized schematic diagram of a system for source and channel decoding according to an embodiment of the present invention.

It will be understood that retrieval of data stored in accordance with embodiments of the invention may operate substantially in the reverse. FIG. 4 depicts a generalized schematic diagram of a system 400 for source and channel decoding according to an embodiment of the present invention. Processor 405 may retrieve stored channel-encoded data from storage medium 440 and channel decoded by channel decoder 430, e.g., using error correction techniques to correct possible storage errors, to obtain channel-decoded data. The channel-corrected data may then be source-decoded by source decoder 420 to obtain raw retrieved data. Processor 405 may also retrieve stored analog-mapped data from storage medium 440, and perform an unmapping or inverse analog mapping of the data by analog mapper 480 to obtain difference information. The difference information may be combined with raw retrieved data by an adder or combiner 470 to obtain final retrieved data 410, which may be provided to a host or other requesting device.

According to embodiments of the invention, there is provided a system and method to limit the size of errors to small error value changes. In one example, errors may occur at a rate or probability inversely proportional to the size or value change of that error. Therefore, relatively large errors may occur at a relatively lower probability than relatively small errors. By shifting the frequency of errors away from higher value changes to lower value changes, the overall sizes of the errors are minimized for more accurate storage.

To limit the sizes of errors, a multi-level cell memory may be used. In contrast to standard memories where different valued bits are stored with no physical difference, multi-level cell memories may store each different bit using a different physical configuration of electrons in an insulating layer. A multi-level cell memory may be divided into cells or slots with one or more floating-gate transistors. Each multi-level memory cell may store multiple bits of information. Data may be written to each cell by injecting electrons between electrically isolated floating-gates in the cells, where the electrons may be trapped by the insulating properties of the floating-gates. Similarly, data may be erased by removing electrons from the cells of the insulating layer. To read the multi-level cell memory, a voltage may be applied to the gate of a cell and it is determined whether or not the cell conducts current. Typically, the lowest possible voltage applied at the gate to change the state of the cell from conductive to non-conductive determines the amount of charge stored in the floating gate.

An error may occur when one or more electrons escape from a cell. The resulting voltage profile of the cell may shift by approximately one voltage range for each escaped electron. However, since electrons are physical objects trapped by physical forces, the probability of electrons escaping may decrease exponentially as the number of escaped electrons increases. Thus, most errors occur by losing a relatively small amount of electrons, shifting the voltage profile of the cell by a single voltage range to an adjacent voltage range.

Adjacent voltage ranges in the multi-level cell memory may be associated with relatively similar bit values, for example, differing by one or another small bit value. Analog values may be quantized or divided into multiple analog value ranges to be mapped to a finite set of values for digitization. The analog value ranges may be mapped, such that each sequentially increasing range is mapped to a sequentially increasing bit value and a corresponding sequentially increasing voltage range. Thus, a shift of one voltage range may result in a minimal bit value difference and a minimal corresponding analog value difference of a single analog value range. Accordingly, errors for larger value differences (e.g., shifting multiple voltage ranges and multiple analog value ranges) are less probable than errors for smaller value differences (e.g., shifting a single voltage range and a single analog value range). Accordingly, most errors will be limited to a shift of a single voltage range, a single bit value and a single analog value range. Such small analog value changes providing less drastic errors and an overall more accurate storage device for the same error rate, as compared with conventional storage devices. That is, a voltage shift that causes a voltage level in a cell to be read incorrectly as a level adjacent to the intended level may cause significant differences in a typical representation. Thus, for example, in an eight-level cell, by incorrectly reading a cell storing charge at the fifth voltage level, instead of the fourth voltage level, the MSB changes from 0 to 1, thereby causing an analog error of four. In contrast, according to embodiments of the present invention, by assigning sequential values to each adjacent voltage level, reading a voltage level incorrectly may lead to a maximum error of 1.

Figure 5:
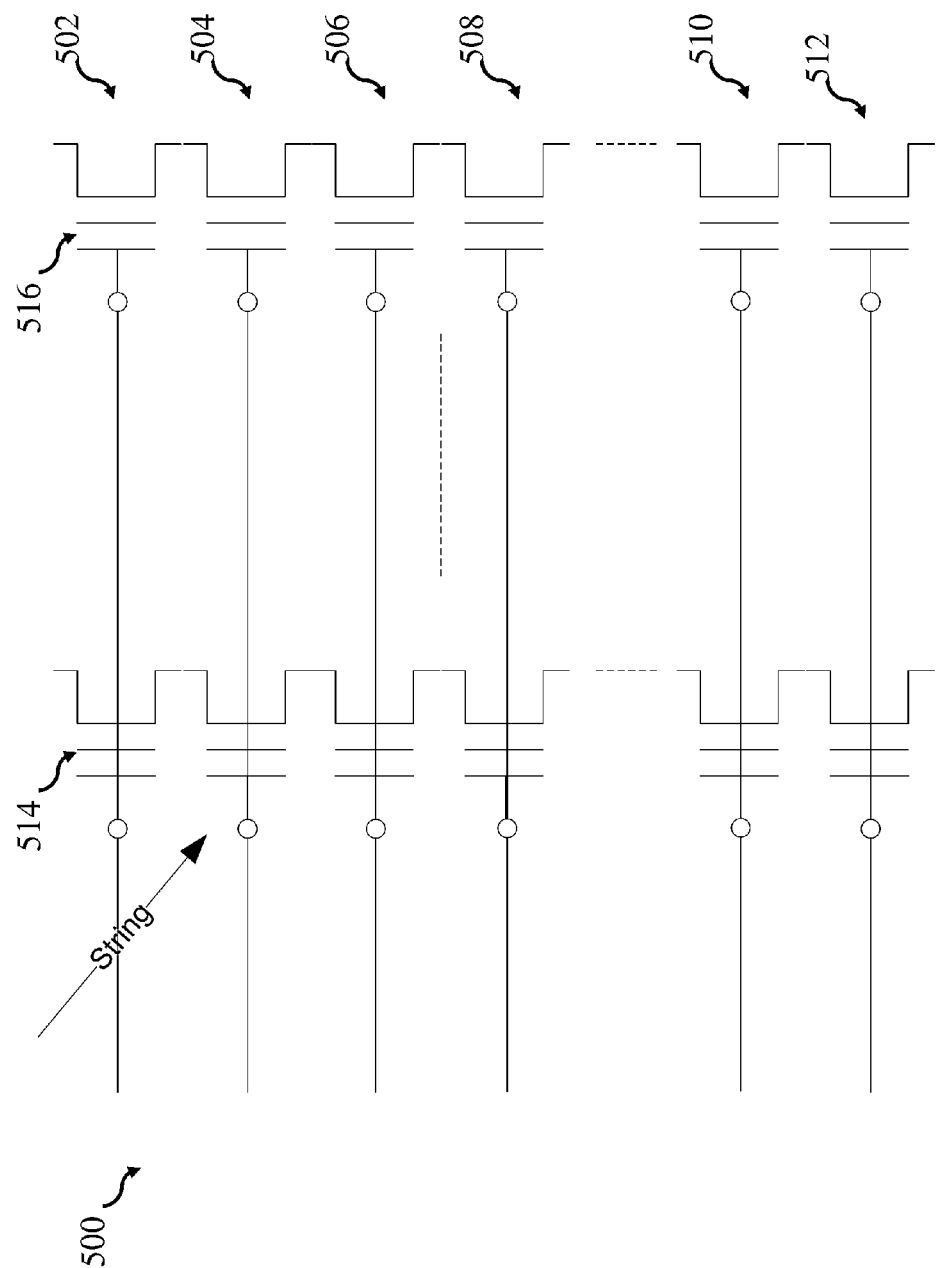
FIG. 5 schematically illustrates a block of cells of a multi-level cell memory according to an embodiment of the invention FIG. 6 schematically illustrates a row of cells programmed in a multi-level cell memory according to an embodiment of the invention.

Reference is made to FIG. 5, which schematically illustrates a block 500 of cells of a multi-level cell memory (e.g., multi-level cell storage medium 230 of FIG. 2) according to an embodiment of the invention. The multi-level cell memory may be, for example, a negated AND (NAND)-flash memory. Block 500 may include a plurality of rows 502-512 and a plurality of columns or strings 514-516. Each row 502-512 includes a plurality of N pages for an N-bit cell memory. Each page may represent a different one of the N bits stored in the cell. In the example of a three-bit cell, each row 502-512 includes 3 pages, for example, corresponding to a most significant bit (MSB), a center significant bit (CSB), and a least significant bit LSB. In one example, a single memory block 500 may include 64 rows, each row including 3 pages, each page including approximately 8 kilobytes (KB) to generate approximately 65,000 strings of 64 cell or transistor groups.

A cell of block 500 may be programmed by injecting electrons therein, for example, to switch certain one-bit values to 0-bit values, in one or more of the multiple pages for each row. Each different configuration of 1- and 0-bit values for the multiple pages for each cell may correspond to a different voltage range and a different bit value.

An entire row 502-512 and/or page of block 500 may be read from the flash memory. To read a row, a bias voltage may be applied to all rows not being read and a reference threshold voltage may be applied to the row being read. The bias voltage may allow the transistors of block 500 to fully conduct. The cells on the row being read may conduct only if the threshold voltage is sufficiently high to overcome the trapped charge in the cell. At the bottom of each string there may be a comparator, which measures the current and outputs either a "1" or a "0" depending on whether or not the current through that string exceeds a certain threshold.

A NAND flash memory architecture may be programmed, for example, as follows: (1) Each entire page of cells (e.g., 2 KB, 4 KB or 8 KB in size) may be read or programmed together. That is, portions of a page may not be read or programmed separately; (2) each entire block 600 of cells may be erased together; and (3) an entire block 600 may be erased before a page therein is reprogrammed.

A NAND flash memory device may include multiple blocks 500 and each block 500 may be erased independently of the other blocks.

Figure 6:
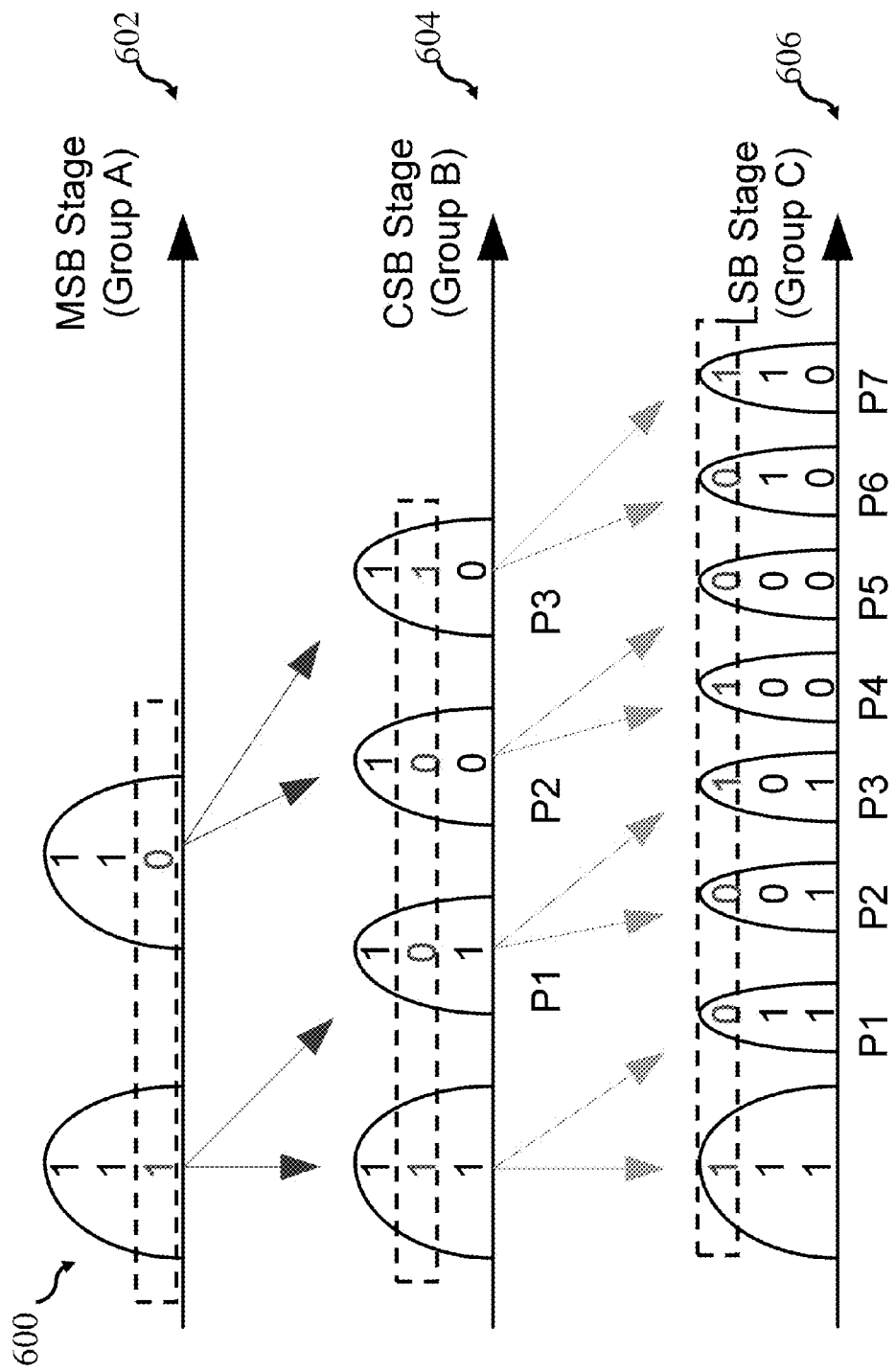

Reference is made to FIG. 6, which schematically illustrates a row 600 of cells programmed in a multi-level cell memory according to an embodiment of the invention. To program a row 600 including a plurality of (N) pages 602-606, each page may be individually programmed, for example, by injecting electron pulses to switch (1)-bit values to (0)-bit values. In the example shown in FIG. 6 for a three-level cell, row 600 includes (3) pages 602-606, a first page 602 storing electrons for a most significant bit (MSB) (e.g., the bottom row of bits), a second page 604 storing electrons for a center significant bit (CSB) (e.g., the center row of bits), and a third page 606 storing electrons for a least significant bit (LSB) (e.g., the top row of bits).

Although each cell is defined by the cumulative electron configurations of all of multiple pages 602-606, when multiple pages 602-606 for a single cell are programmed simultaneously or even consecutively, pages 602-606 may experience an undesirable coupling effect. Accordingly, the multiple pages 602-606 for each row may not be programmed simultaneously, but instead may be staggered or programmed at different times. In some embodiments, each sequential page 602-606 may be programmed in the order of increasing bit value, for example, the MSB page 602 first, the CSB page 604 second, and the LSB page 606 first, although other orders may be used.

Each page may be programmed with (e.g., 2) lobes (e.g., the erase lobe and the "0" lobe). In a first programming stage, all cells in row 600 have a single page 602 (e.g., the MSB page) thereby defining (2) lobes for row 600. In a second programming stage, an additional page 604 (e.g., the CSB page) may be programmed to row 600, thereby splitting each of the (2) existing lobes into (2) extra lobes for a total of (4) lobes in row 600. In a third programming stage, an additional page 606 (e.g., the LSB page) may be programmed to row 600, thereby splitting each of the (4) existing lobes into (2) extra lobes for a total of (8) lobes in row 600. The lobe splitting may be determined according to the bit values shown in FIG. 6. For example, when programming a CSB page, if the cell was at the erase level, the cell will not be injected with additional electrons if the corresponding CSB bit was a "1". On the other hand, if the corresponding CSB bit was a "0", additional charge may be injected until the cells threshold voltage lie within lobe P1 of row 604. If after the MSB page programming, the cell was in the right lobe ("0" MSB bit) of row 602, some additional charge may be injected to put the cell in lobe P2 of row 604 if the corresponding CSB bit was "0", and more electrons may be injected to put the cell in the P3 lobe of row 604 with the corresponding CSB bit was a "1".

Figure 7:
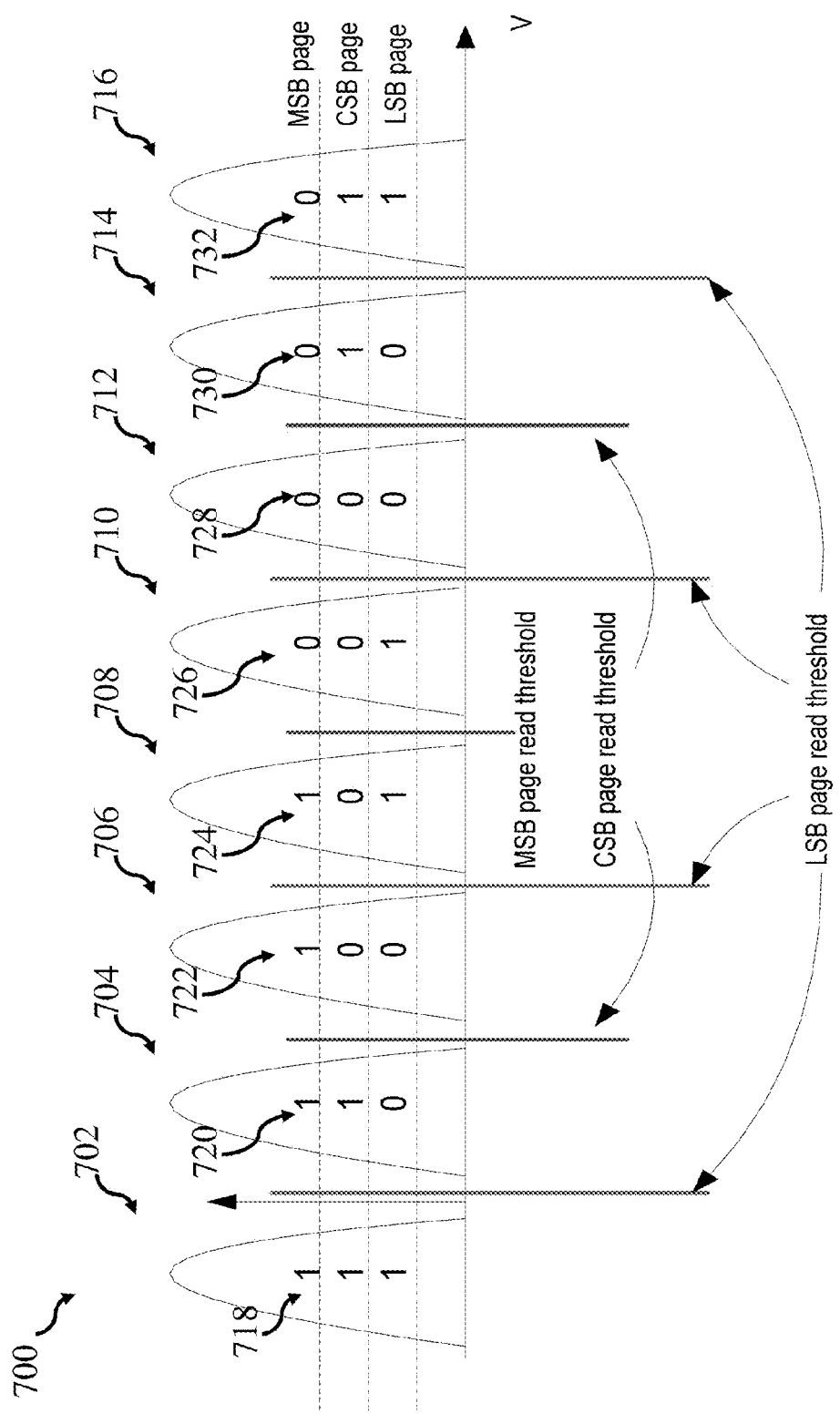
FIG. 7 schematically illustrates a voltage profile for the multiple states in a cell in a three-level cell memory.

To read an MSB page, only a single threshold comparison may be performed. For reading a CSB page, two read thresholds are to be used in order to determine the bit value of every CSB associated cell. For LSB pages, the bit-values are determined using the four read thresholds, as shown in FIG. 7.

It is common that logical pages that belong to the same row are not programmed consecutively, but rather in an interleaved fashion, in order to reduce the coupling effect between pages. It has been suggested in the prior art to write the LSB of a given row after the MSB and CSB pages of the following rows have already been programmed. The same applies for CSB pages: a CSB page is programmed only after all MSB pages of consecutive rows are programmed. The following table shows a standard page programming order:

| Row # | MSB | CSB | LSB |
|-------|-----|-----|-----|
| 0 | 0 | 2 | 5 |
| 1 | 1 | 4 | 8 |
| 2 | 3 | 7 | 11 |
| 3 | 6 | 10 | 14 |
| 4 | 9 | 13 | 17 |
| 5 | 12 | 16 | 20 |
| 6 | 15 | 19 | 22 |
| 7 | 18 | 21 | 23 |

The numbers indicate the order of the pages being programmed (in this example there are 8 rows, and each row is programmed to 3 bits per cell). Note that for any given LSB page, the MSB and CSB pages of neighboring rows are programmed before that LSB page. For example, the LSB page number 14 in row number 3 is programmed after MSB and CSB pages of row number 3 are programmed (pages 6 and 10) and not before the MSB and CSB pages of row number 4 are also programmed. In this manner, the program coupling effects are decreased.

It may be appreciated that each voltage range is shown to be non-overlapping in the figures to simplify the schematic illustration and that adjacent voltage ranges may overlap. Overlapping voltage ranges may be intentional used for obtaining high programming speed or unintentionally due to retention effects. For floating gate devices, an "old" page, may introduce greater overlap between lobes than a new page, since after many program/erase (P/E) cycles there is accumulated trap charge, which is de-trapped over time. After a long duration, every lobe may have a larger standard deviation and may have a different mean location. These affects are also known as retention. These are just two examples for overlapping distributions. There may be many more, such as read disturbs, or programming disturbs, etc.

Reference is made to FIG. 7, which schematically illustrates a voltage profile 700 for the multiple states in a cell in a multi-level cell storage medium 230 of FIG. 2, according to an embodiment of the invention. Each cell in the multi-level cell memory may store a plurality of N=3 bits of information, for example, in floating-gate transistors. Each cell may include (to an acceptable level of certainty) more than two statistically distinguishable levels or voltage ranges 702-716, for example, corresponding to different combinations of binary digits, defining $2^N$ binary states or bit values for the N bits in each cell. The number N of bits of information in cells of the multi-level cell memory may be greater than one and may or may not be an integer number. In the example in FIG. 7, three bits are stored in each cell defining ($2^3$=8) different voltage ranges 702-716 and ($2^3$) corresponding different three-bit value combinations 718-732. According to commonly accepted industry practice, there is one most significant (MSB) page read threshold; there are two central significant bit (CSB) page read thresholds; and there are four least significant bit (LSB) page read thresholds, as depicted in FIG. 7. Accordingly, the values associated with the voltage levels, e.g., 1,1,1 for voltage level 702; 1,1,0 for voltage level 704, etc., are commonly used.

As explained below, in some embodiments of the invention, the commonly used bit values corresponding to the voltage levels, for example, as shown in FIG. 7, may be mapped or used to correspond to different values, for example, a continuous and sequentially increasing range of values, such as difference information. For example, for reasons described below, analog values within each of a plurality of ranges may be mapped to the respective binary values.

Thus, for example, analog values in each of eight difference ranges or bins may be mapped to each of the MSB, CSB, LSB values, such that the lowest voltage level (e.g., voltage level 702 corresponding to MSB, CSB, LSB values 718 of 1,1,1), represents a smallest analog value, and each increasing voltage range represents a correspondingly increasing analog value. Thus, for example, an analog mapper may associate a difference represented by 0 (for example, where the difference is in the lowest range) with (1,1,1), to be stored as voltage level 702; a difference value represented by 1 (for example, where the difference is in the next-lowest range) with (1,1,0), to be stored as voltage level 704; and a quantized difference value of 7 (for example, where the difference is in the highest range) with (0,1,1), to be stored as voltage level 716. Such a mapping scheme may make use of known Flash memory controllers, which are already configured to store the commonly used MSB, CSB, LSB value combinations with corresponding voltage levels. It will be understood that any range of difference values may be assigned to the voltage levels. For example, the lowest voltage level may represent a difference of −3, and each sequential voltage level may represent an incremental difference of 1, until the highest voltage level represents a difference of 4 for lobes 702 up to 716. In both described cases the difference in values of corresponding adjacent lobes would be 1. In addition, the number of difference values need not be an exact power of two (e.g., four, eight, sixteen, etc.). For example, seven difference values (e.g., ±3, including 0) may be represented by mapping the difference to a three-bits eight-level representation, in which any two adjacent lobes may be "fused" to represent a single difference value.

According to embodiments of the invention, sequential analog value ranges may be associated with sequentially increasing voltage ranges, respectively. An analog value in each analog value range may be mapped, for example, according to a predefined mapping, to a corresponding bit value having a voltage in a corresponding voltage range. In one example, analog values in a quantized range of from zero to m [0,m] may map analog values in a first value range $$\left[0, \frac{m}{2^N}\right)$$

to a first bit value (e.g., 0); analog values in a second value range $$\left[\frac{m}{2^N}, \frac{m}{2^N - 1}\right)$$

to a second bit value (e.g., 1); and analog values in a final value range $$\left[\frac{m}{2^N - (2^N - 1)}, m\right]$$

to a $(2^{N\,th})$ bit value (e.g., $2^N - 1$). It may be appreciated that the $(2^N)$ analog value ranges may be divided differently (e.g., evenly or unevenly, linearly or exponentially) and may include or exclude boundary values. Furthermore, the associated bit-values may begin from 0 and increase or may start from a negative bit-value and increase, or other bit-value orderings may be used.

In one example, for an eight-level cell (characterized by three bit values, i.e., MSB, CSB, LSB), the cell may have $(2^3=8)$ sequentially increasing bit values (each incremented by a single bit) (row 2 of Table 1) defined by the (3) bits in the (3)-level cell. Analog values (normalized on a range of 0 to 10) may be divided into the same number of (8) analog ranges (row 1 of Table 1). Values in each sequentially increasing analog range may be mapped to a sequentially increasing difference value (e.g., 0 to 7). Each of the eight difference values may correspond to a unique voltage range 702-716, as represented by the associated MSB, CSB, LSB of the three-level cell (row 3 of Table 1).

TABLE 1

Correlation between Analog Value Range, Difference Values, and Voltage Ranges in a single (3)-Level Cell of an MLC memory

| | Analog Range | | | | | | | |
|---|---|---|---|---|---|---|---|---|
| | [0-1.25) | [1.25-2.5) | [2.5-3.75) | [3.75-5.0) | [5.0-6.25) | [6.25-7.5) | [7.5-8.75) | [8.75-10] |
| Diff. Value | 0 | 1 | 2 | 3 | 4 | 5 | 6 | 7 |
| MSB, CSB, LSB | 1, 1, 1 | 1, 1, 0 | 1, 0, 0 | 1, 0, 1 | 0, 0, 1 | 0, 0, 0 | 0, 1, 0 | 0, 1, 1 |

Once the analog difference value is calculated and associated with one of up to eight quantized difference value, the corresponding three MSB, CSB, LSB values may be passed to a memory controller for storage in the Flash memory. Likewise, upon reading the information, a known memory controller may read the three MSB, CSB, LSB values using known methods, and the retrieved value may be inverse mapped to one of the quantized analog values, which may be used in reconstruction of the stored information.

An error may occur when an analog value is stored in the memory at a voltage in a different voltage range corresponding to a different bit value than that defined by the predefined mapping (e.g., in Table 1), or when upon retrieval, the voltage level has drifted from one voltage range to the adjacent voltage range. However, statistically, the erroneous voltage may typically shift at most by a single voltage range to generate an erroneous bit value differing from the correct bit value by a single increment (e.g., shifted by a single column in Table 1). Accordingly, the erroneous bit value may represent an erroneous analog value differing from the correct analog value by a single analog value range (e.g., shifted a column for an analog value difference of 12.5 in Table 1). More drastic error voltages shifted by multiple voltage ranges and corresponding to larger analog errors of multiple analog value ranges are less likely. Accordingly, smaller errors may predominate to increase the accuracy of the storage medium.

Figure 8:
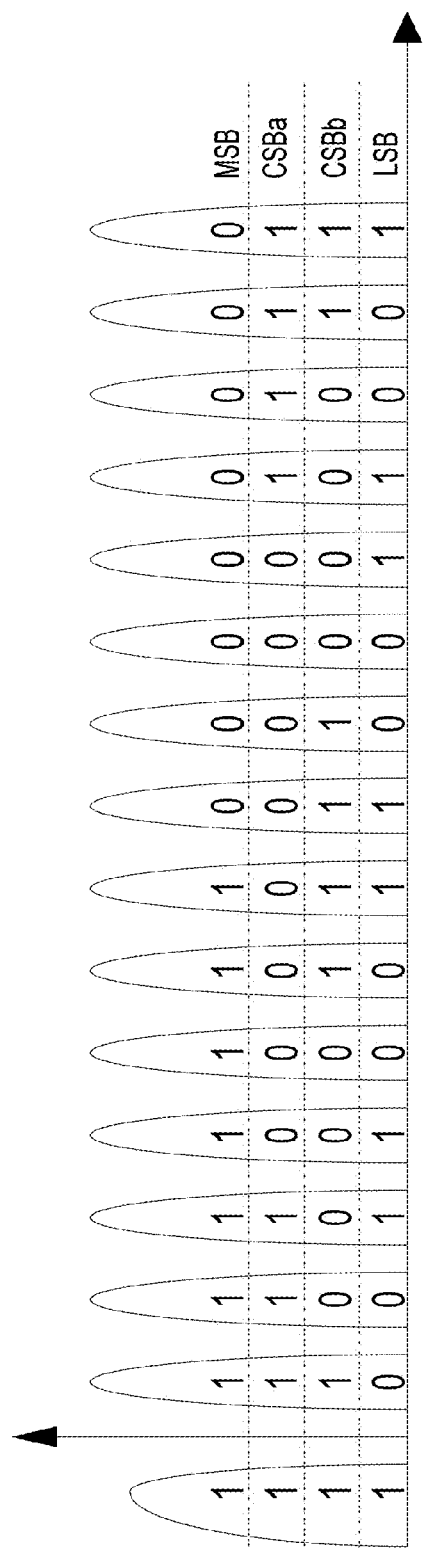
FIG. 8 schematically illustrates a voltage profile for the states in a cell in a four-level cell memory.

Reference is made to FIG. 8, which schematically illustrates a voltage profile for the states in a cell in a four-level cell memory (e.g., multi-level cell storage medium 230 of FIG. 2) according to an embodiment of the invention. The four-level cell may have ($2^4$=16) sequentially increasing difference values (row 2 of Table 2) defined by the four bits in the four-level cell. Normalized analog values (0-100) may be divided into the same number of sixteen analog ranges (row 1 of Table 2). Values in each sequentially increasing analog range may be mapped to a sequentially increasing difference value (e.g., aligned in columns in Table 1). Each of the sixteen bit values may correspond to a unique voltage range for a unique configuration for each of the four bits of the four-level cell (row 3 of Table 2).

TABLE 2

Correlation between Analog Value Ranges, Difference Values and Voltage Ranges in a Single Cell of a Four-Bit MLC memory

| | Analog Range | | | | | | | |
|---|---|---|---|---|---|---|---|---|
| | [0-6.25) | [6.25-12.5) | [12.5-18.75) | [18.75-25) | [25-31.25) | [31.25-37.5) | [37.5-43.75) | [43.75-50) |
| Bit Value MSB, CSBa, CSBb, LSB | 0<br>1, 1, 1, 1 | 1<br>1, 1, 1, 0 | 2<br>1, 1, 0, 0 | 3<br>1, 1, 0, 1 | 4<br>1, 0, 0, 1 | 5<br>1, 0, 0, 0 | 6<br>1, 0, 1, 0 | 7<br>1, 0, 1, 1 |

| | Analog Range | | | | | | | |
|---|---|---|---|---|---|---|---|---|
| | [50-56.25) | [56.25-62.5) | [62.5-68.75) | [68.75-75) | [75-81.25) | [81.25-87.5) | [87.5-93.75) | [93.75-100] |
| Bit Value MSB, CSBa, CSBb, LSB | 8<br>0, 0, 1, 1 | 9<br>0, 0, 1, 0 | 10<br>0, 0, 0, 0 | 11<br>0, 0, 0, 1 | 12<br>0, 1, 0, 1 | 13<br>0, 1, 0, 0 | 14<br>0, 1, 1, 0 | 15<br>0, 1, 1, 1 |

As with the example of Table 1, once the analog difference value is calculated and associated with one of up to sixteen quantized difference value, the corresponding four MSB, CSB, LSB values may be passed to a memory controller for storage in the Flash memory Likewise, upon reading the information, a known memory controller may read the four MSB, CSB, LSB values using known methods, and the retrieved value may be inverse mapped to one of the quantized analog values, which may be used in reconstruction of the stored information.

It will be recalled that the prior art scheme mapping, as shown in rows 3 and 6, for example voltage levels with the MSB, CSB, LSB values is designed so that if a multi-level cell is read incorrectly, e.g., to an adjacent voltage level, the error will cause no more than one bit to be read incorrectly (e.g., 1,0,1 may be read as 0,0,1, causing an error in only the MSB). However, although such error may occur to any one of the bits with an equal probability, the significance of such errors is not equal, particularly in cases of an analog value being stored, because each bit many not necessarily be equally weighted or valued. For example, if the MSB, CSB, LSB values represent a numerical value in binary form, each more significant bit represents an exponentially increasing value (e.g., 1, 2, 4, 8, 16, . . . increasing by powers of two in a standard binary representation). Accordingly, if the prior art mapping scheme were to be used, errors may occur at the same rate for bits having relatively more significance (e.g., causing a relatively high amount of error) and bits having relatively less significance (e.g., causing a relatively small amount of error).

According to the analog mapping scheme of the present invention, as shown in rows 2 and 5, for example, as described above, a shift in the voltage level would cause a shift from one error or difference to an adjacent one, causing uniform error, regardless of which voltage level is affected. Accordingly, errors would limited to small amount (e.g., a single analog value range) decreasing the overall error in storage medium, for example, as compared to conventional storage mediums.

Figure 9:
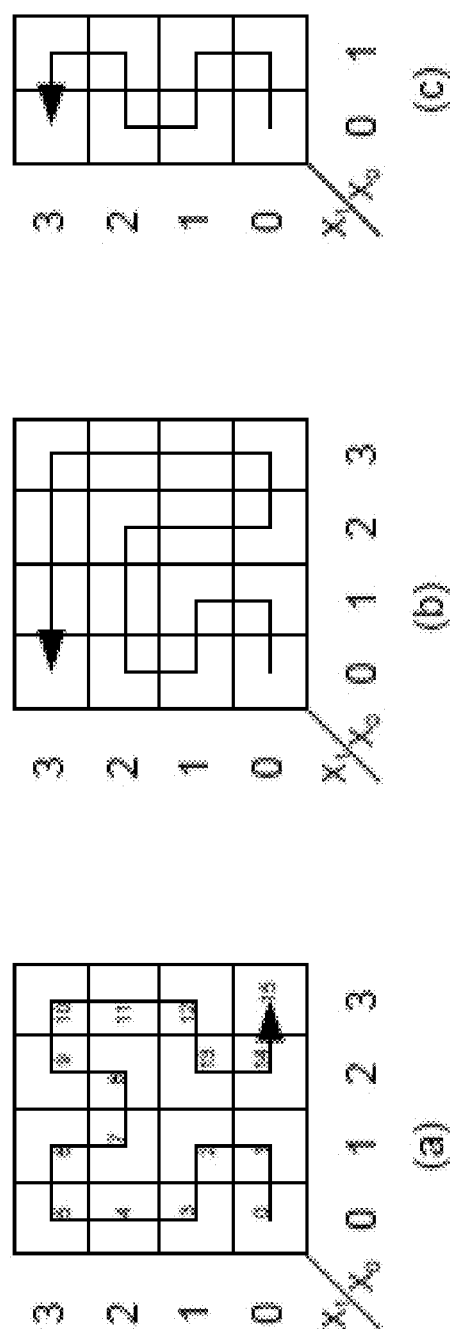
FIG. 9 shows two analog mapping schemes consistent with embodiments of the present invention.

Reference is made to FIG. 9, which shows two other analog mapping schemes consistent with the above rationale. For example, taking the four-bit MLC example, the four bits may be used to represent two two-bit error or difference data, represented by X0 and X1. By arranging the values onto a grid, any path that covers the entire grid, and advances by contiguous squares (i.e., no change in one dimension, and a change of one in the other direction) will produce a similar effect. Examples are provided in FIG. 9(a) and FIG. 9(b). The advancement in the curve may correspond to advancement in the corresponding lobe as shown in FIG. 8, starting from the left-most one and increasing one by one until the right-most one. The associated square corresponds to X0 and X1 values. A similar scheme may also be applied to a three-bit MLC which may represent two analog values, one a 1-bit error value and the other is a 2-bit error value, as shown in FIG. 9(c).

In the above examples, it may be noted that a square bracket may indicate the inclusion of a boundary value and a curved bracket or parenthesis may indicate the exclusion of the boundary value.

In some embodiments of the invention, the source-encoded value may be fully channel-encoded and stored, and the analog difference used as an error check. The analog error correction data may be a more compact encoding of the error compared with digital error correction data and may thereby use less digital storage resources and increase the storage density and accuracy of the digital medium Likewise, in some embodiments, embodiments of the invention may be used to provide additional resolution not attainable by the channel-encoded data. Alternatively, in some embodiments of the invention, the analog error correction data may provide a means to moderate the effect of large errors in the storage medium, so as to incur a graceful degradation in the reconstructed source corresponding to the number of errors in the storage media. Thus, for example, when a significant amount of errors occurred in the storage medium, instead of a completely garbled image, an image may nevertheless be reconstructed, albeit with errors.

In other embodiments of the invention, only a most significant portion of the source-encoded data may be channel-encoded and stored. A complementary least significant portion of source data may be used as the difference portion, analog-mapped, and stored in accordance with the above description. Accordingly, upon retrieval, the analog-unmapped least significant portion may simply be appended to, or combined with, the most significant channel-decoded and source-decoded portion.

Figure 10:
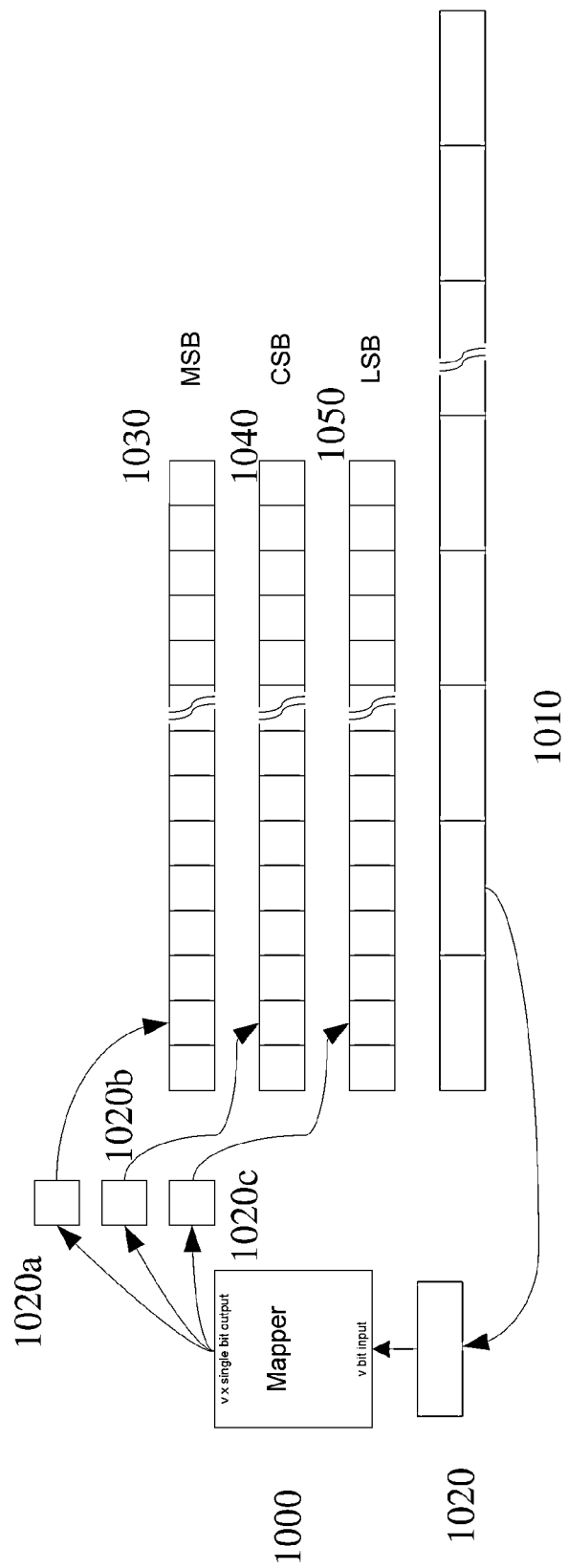
FIG. 10 is a schematic illustration of an analog mapper in accordance with an embodiment of the present invention.

Reference is made to FIG. 10, which is a schematic illustration of an analog mapper 1000 in accordance with an embodiment of the present invention. A plurality of difference values may be obtained, for example, by difference operator 370 in FIG. 3. These difference values may be stored in a buffer memory 1010 for mapping. A difference value 1020 may be provided to analog mapper 1000. The mapper may receive the N-bit input, for example, three-bit input in the example of FIG. 10, and perform a mapping, for example, as described above in connection with Table 1. For example, for a difference value of 1, the mapper may obtain 110, representing MSB of 1, CSB of 1, and LSB of 0. The mapper may individually output the MSB 1020a, CSB 1020b, and LSB 1020c of the mapped values to MSB page buffer 1030, CSB page buffer 1040, and LSB page buffer 1050, respectively. When the page buffers are full, they may be written to each page of the MLC storage medium.

Figure 11:
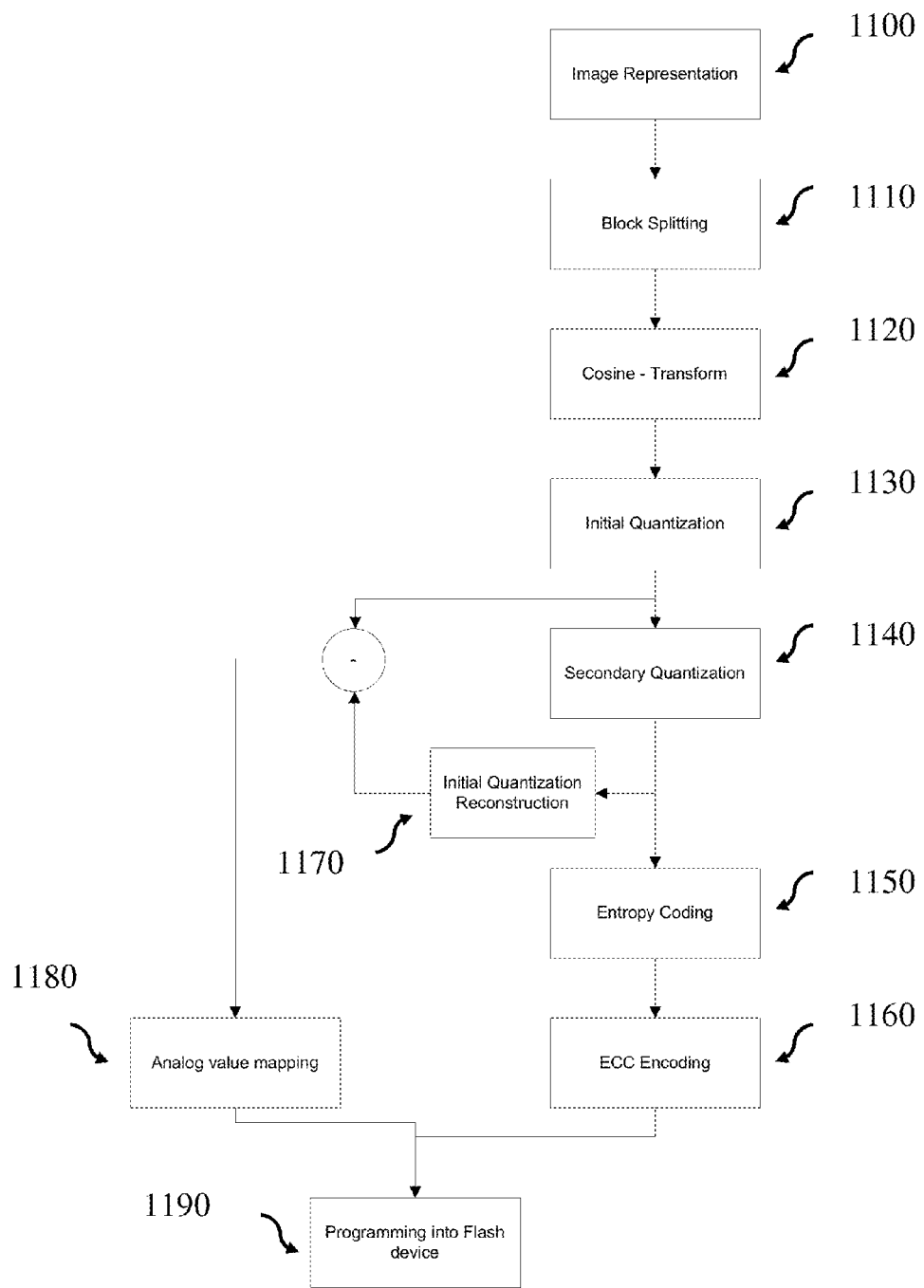
FIG. 11 is a schematic flow diagram of a source and channel encoding method in accordance with embodiments of the present invention.

Reference is made to FIG. 11, which is a schematic flow diagram of an image encoding method in accordance with embodiments of the present invention. First, in the image representation stage 1100, an image is broken up into pixels and each pixel is represented using its Y, Cr, Cb components. Next, in the block splitting stage 1110, the matrices are broken up into sub-matrices. In the cosine transform stage 1120, each sub-matrix is transformed into the frequency domain by using a two dimensional cosine transform. In the initial quantization stage 1130, each element in the frequency domain may optionally be quantized. In the method depicted in FIG. 11, the output of stage 1130 may be referred to as the analog source data. The secondary quantization step 1140 may be a compression stage to compress the data. Thus, the output of stage 1140 may be considered the source-encoded data. The secondary quantization step of 1140 may be a coarser quantization scheme than that of stage 1130. For example, the output of quantization step 1130 may be five bit values, while that of stage 1140 may be coarser, and quantized down to three bit values, which may be easily performed, for example, by taking the upper three bits of the bit values generated by stage 1130. Alternatively, a more complex operation may be performed, such as taking the upper three bits of the five-bit values of stage 1130, and adding a 1 if the lower two bits of that five-bit value were 11 or 10 (i.e. rounding). Clearly, these are examples and should not be construed as limiting the scope of the invention. Other, more complex, quantization methods may be applied as well. At stage 1170, the data is reconstructed and compared with source data to obtain a difference value. The difference value may be mapped by analog mapping stage 1180, and stored into flash memory at programming stage 1190. In parallel, the quantized data may be channel-encoded by entropy coding stage 1150 and error correction encoding 1160, at which point, the channel-encoded output may be stored into flash memory at programming stage 1190.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A method comprising: obtaining a value of source data; encoding the value of source data using an encoding process, to thereby obtain an encoded value; calculating a difference value based on the value of source data and the encoded value; mapping the difference value to a multi-digit binary value associated with a voltage level based on a mapping scheme; causing a cell of a multi-level cell memory to store the mapped multi-digit binary value; and causing the encoded value of source data to be stored in the multi-level cell memory.

2. The method of claim 1, wherein the mapping scheme comprises mapping difference values within increasing ranges to multi-digit binary values having increasing associated voltage levels.

3. The method of claim 2, wherein the multi-digit binary values are associated with respective voltage levels, so that no more than one bit of the multi-digit binary values differs between adjacent voltage levels.

4. The method of claim 1, wherein causing the cell of the multi-level cell memory to store the mapped multi-digit binary value comprises sending an instruction to a memory controller associated with the multi-level cell memory.

5. The method of claim 1, wherein the difference value is a quantized difference value, and wherein calculating the quantized difference value comprises: calculating a difference between the value of source data and the encoded value, and determining which of a plurality of quantized difference values includes the calculated difference.

6. The method of claim 5, wherein each of the quantized difference values correspond to an equal range of corresponding difference values.

7. The method of claim 5, wherein at least two of the quantized difference values correspond to unequal ranges of corresponding difference values.

8. The method of claim 1, wherein causing the cell of the multi-level cell memory to store the mapped multi-digit binary value comprises programming the cell of the multi-level cell memory by: for a plurality of mapped multi-digit binary values, writing each significant bit of the mapped multi-digit binary values to each of a plurality of corresponding page buffers, respectively, until the page buffers are full, and programming pages of the multi-level cell memory based on the page buffers.

9. The method of claim 1, further comprising: obtaining first and second values of source data; encoding the first and second values of source data using an encoding process, to thereby obtain first and second encoded values, respectively; calculating first and second difference values, wherein the first difference value is based on the first value of source data and the first encoded value, and wherein the second difference value is based on the second value of source data and the second encoded value; and mapping the first and second difference values to a single multi-digit binary value associated with a voltage level using the mapping scheme.

10. The method of claim 9, wherein the mapping scheme comprises mapping the first and second difference values to multi-digit binary values such that for adjacent voltage levels associated with respectively adjacent mapped multi-digit binary values, no more than one of the first and second difference values differs by no more than one difference level.

11. The method of claim 9, wherein one of the first and second difference values is a two-bit binary number, and the other of the first and second difference values is a one-bit binary number, and wherein the mapping scheme includes up to eight voltage levels corresponding to up to eight possible combined first and second difference values.

12. The method of claim 9, wherein each of first and second difference values is a two-bit binary number, and wherein the mapping scheme includes up to sixteen voltage levels corresponding to up to sixteen possible combined first and second difference values.

13. The method of claim 1, wherein source data is raw image data, wherein the encoding process is a Joint Photographic Experts Group (JPEG) encoding process, and further comprising performing at least one of entropy coding and error correction coding on encoded data prior to causing the encoded value of source data to be stored.

14. A method comprising: causing a value of encoded source data to be obtained from a multi-level cell memory; decoding the value of encoded source data to obtain a value of decoded source data; causing a multi-digit binary value associated with the value of encoded source data to be obtained from a cell of the multi-level cell memory; mapping the obtained multi-digit binary value to a difference value based on a mapping scheme; and modifying the value of decoded source data based on the difference value to obtain retrieved data.

15. The method of claim 14, wherein causing the multi-digit binary value to be obtained comprises sending an instruction to a memory controller associated with the multi-level cell memory.

16. The method of claim 15, further comprising: causing first and second values of encoded source data to be obtained from a multi-level cell memory, decoding the first and second values of encoded source data to obtain first and second values of decoded source data, causing a multi-digit binary value associated with the first and second values of encoded source data to be obtained from a cell of the multi-level cell memory, mapping the obtained multi-digit binary value to first and second difference values based on the mapping scheme, modifying the first and second values of decoded source data based on the first and second difference values, to obtain first and second values of retrieved data.

17. A non-transitory computer readable medium that stores instructions that once executed by a computer cause the computer to execute the stages of:
obtaining a value of source data; encoding the value of source data using an encoding process, to thereby obtain an encoded value;
calculating a difference value based on the value of source data and the encoded value;
mapping the difference value to a multi-digit binary value associated with a voltage level based on a mapping scheme;
causing a cell of a multi-level cell memory to store the mapped multi-digit binary value; and
causing the encoded value of source data to be stored in the multi-level cell memory.

18. The non-transitory computer readable medium of claim 17, wherein the mapping scheme comprises mapping difference values within increasing ranges to multi-digit binary values having increasing associated voltage levels.

19. The non-transitory computer readable medium of claim 18, wherein the multi-digit binary values are associated with respective voltage levels, so that no more than one bit of the multi-digit binary values differs between adjacent voltage levels.

20. The non-transitory computer readable medium of claim 17, wherein the non-transitory computer readable medium stores instructions for sending an instruction to a memory controller associated with the multi-level cell memory.

21. The non-transitory computer readable medium of claim 17, wherein the difference value is a quantized difference value, and wherein the non-transitory computer readable medium stores instructions for calculating a difference between the value of source data and the encoded value, and determining which of a plurality of quantized difference values includes the calculated difference.

22. The non-transitory computer readable medium of claim 21, wherein each of the quantized difference values correspond to an equal range of corresponding difference values.

23. The non-transitory computer readable medium of claim 21, wherein at least two of the quantized difference values correspond to unequal ranges of corresponding difference values.

24. The non-transitory computer readable medium of claim 17, wherein the non-transitory computer readable medium stores instructions for programming the cell of the multi-level cell memory by: for a plurality of mapped multi-digit binary values, writing each significant bit of the mapped multi-digit binary values to each of a plurality of corresponding page buffers, respectively, until the page buffers are full, and programming pages of the multi-level cell memory based on the page buffers.

25. The non-transitory computer readable medium of claim 17, wherein the non-transitory computer readable medium stores instructions for: obtaining first and second values of source data; encoding the first and second values of source data using an encoding process, to thereby obtain first and second encoded values, respectively; calculating first and second difference values, wherein the first difference value is based on the first value of source data and the first encoded value, and wherein the second difference value is based on the second value of source data and the second encoded value; and mapping the first and second difference values to a single multi-digit binary value associated with a voltage level using the mapping scheme.

26. The non-transitory computer readable medium of claim 25, wherein the mapping scheme comprises mapping the first and second difference values to multi-digit binary values such that for adjacent voltage levels associated with respectively adjacent mapped multi-digit binary values, no more than one of the first and second difference values differs by no more than one difference level.

27. The non-transitory computer readable medium of claim 25, wherein one of the first and second difference values is a two-bit binary number, and the other of the first and second difference values is a one-bit binary number, and wherein the mapping scheme includes up to eight voltage levels corresponding to up to eight possible combined first and second difference values.

28. The non-transitory computer readable medium of claim 25, wherein each of first and second difference values is a two-bit binary number, and wherein the mapping scheme includes up to sixteen voltage levels corresponding to up to sixteen possible combined first and second difference values.

29. The non-transitory computer readable medium of claim 17, wherein source data is raw image data, wherein the encoding process is a JPEG encoding process, and wherein the non-transitory computer readable medium stores instructions for performing at least one of entropy coding and error correction coding on encoded data prior to causing the encoded value of source data to be stored.

30. A non-transitory computer readable medium that stores instructions that once executed by a computer cause the computer to execute the stages of causing a value of encoded source data to be obtained from a multi-level cell memory; decoding the value of encoded source data to obtain a value of decoded source data; causing a multi-digit binary value associated with the value of encoded source data to be obtained from a cell of the multi-level cell memory; mapping the obtained multi-digit binary value to a difference value based on a mapping scheme; and modifying the value of decoded source data based on the difference value to obtain retrieved data.

31. The non-transitory computer readable medium of claim 30, wherein the non-transitory computer readable medium stores instructions for sending an instruction to a memory controller associated with the multi-level cell memory.

32. The non-transitory computer readable medium of claim 31, wherein the non-transitory computer readable medium stores instructions for causing first and second values of encoded source data to be obtained from the multi-level cell memory, decoding the first and second values of encoded source data to obtain first and second values of decoded source data, causing a multi-digit binary value associated with the first and second values of encoded source data to be obtained from a cell of the multi-level cell memory, mapping the obtained multi-digit binary value to first and second difference values based on the mapping scheme, modifying the first and second values of decoded source data based on the first and second difference values, to obtain first and second values of retrieved data.

* * * * *